United States Patent [19]

Asano

[11] Patent Number: 5,761,119
[45] Date of Patent: Jun. 2, 1998

[54] NONVOLATILE SEMICONDUCTOR MEMORY WITH A PLURALITY OF ERASE DECODERS CONNECTED TO ERASE GATES

[75] Inventor: Masamichi Asano, Tokyo-To, Japan

[73] Assignee: Kabushiki Kaisha Toshiba, Kawasaki, Japan

[21] Appl. No.: 273,922

[22] Filed: Jul. 12, 1994

Related U.S. Application Data

[63] Continuation of Ser. No. 989,935, Dec. 10, 1992, Pat. No. 5,418,742, which is a continuation of Ser. No. 662,614, Feb. 28, 1991, abandoned.

[30] Foreign Application Priority Data

Feb. 28, 1990 [JP] Japan ..................... 2-48126

[51] Int. Cl.⁶ ............................... G11C 16/06
[52] U.S. Cl. ..................... 365/185.14; 365/185.05; 365/185.11; 365/185.13; 365/185.29; 365/230.06
[58] Field of Search ................ 365/104, 185, 365/900, 230.06, 185.13, 185.05, 185.11, 185.29, 185.14

[56] References Cited

U.S. PATENT DOCUMENTS

| | | | |
|---|---|---|---|
| 4,247,918 | 1/1981 | Iwahashi et al. | 365/218 |
| 4,366,555 | 12/1982 | Hu | 365/185 |
| 4,408,306 | 10/1983 | Kuo | 365/218 |
| 4,740,766 | 4/1988 | Metz | 323/316 |
| 4,797,856 | 1/1989 | Lee et al. | 365/185 |
| 4,803,529 | 2/1989 | Masuoka | 357/23.5 |
| 4,933,906 | 6/1990 | Terada et al. | 365/208 |
| 4,949,309 | 8/1990 | Rao | 365/218 |
| 4,958,326 | 9/1990 | Sakurai | 365/218 |
| 4,970,692 | 11/1990 | Ali et al. | 365/218 |
| 5,017,978 | 5/1991 | Middlehoek et al. | 357/23.5 |
| 5,020,026 | 5/1991 | Schreck et al. | 365/104 |
| 5,022,008 | 6/1991 | Schreck et al. | 365/201 |
| 5,023,681 | 6/1991 | Ha | 365/185 |
| 5,023,837 | 6/1991 | Schreck et al. | 365/185 |
| 5,034,926 | 7/1991 | Taura et al. | 365/218 |
| 5,047,981 | 9/1991 | Gill et al. | 365/185 |
| 5,065,364 | 11/1991 | Atwood et al. | 365/185 |
| 5,117,389 | 5/1992 | Yiu | 365/104 |
| 5,126,808 | 6/1992 | Montalvo et al. | 365/900 |
| 5,197,029 | 3/1993 | Schreck et al. | 365/185 |
| 5,283,758 | 2/1994 | Nakayama et al. | 365/185 |
| 5,315,547 | 5/1994 | Shoji et al. | 365/900 |

FOREIGN PATENT DOCUMENTS 1-230110  9/1989  Japan.

*Primary Examiner*—Joseph E. Clawson, Jr.
*Attorney, Agent, or Firm*—Foley & Lardner

[57] ABSTRACT

A non-volatile semiconductor memory cell including: a plurality of blocks each having a plurality of floating gate transistors as memory cells, the floating gate transistor having a drain, a source, a floating gate, and a control gate capacitively coupled to the floating gate, and a data program of the floating gate transistor being effected by data write through injection of electrons into the floating gate and by data erase through emission of electrons from the floating gates; a circuit unit for applying an erase signal to a selected one of the blocks to emit electrons from the floating gates of a plurality of memory cells in the selected block and to erase data in all of the memory cells in the selected block at the same time; and a circuit unit for applying a write signal to the drains of the floating gate transistors within the selected block, without applying the write signal to the drains of the floating gate transistors of non-selected blocks.

6 Claims, 14 Drawing Sheets

NONVOLATILE SEMICONDUCTOR MEMORY WITH A PLURALITY OF ERASE DECODERS CONNECTED TO ERASE GATES

This application is a continuation of application Ser. No. 07/989,935, now U.S. Pat. No. 6,418,742, filed Dec. 10, 1992, which is a continuation of application Ser. No. 07/662,614, filed Feb. 28, 1991.

FIELD OF THE INVENTION

The present invention relates to a nonvolatile semiconductor memory whose data can be electrically erased, and more particularly, to a nonvolatile semiconductor memory capable of preventing erroneous operation of non-selected cells by shortening the time during which a voltage stress is applied to the non-selected cells.

BACKGROUND OF THE INVENTION

An Electrically Erasable and Programmable ROM (EEPROM) can electrically erase and write data by using an electric signal while it is mounted on a circuit board. Therefore, it is more useful than an EEPROM of an ultraviolet erase type. Demand for EEPROMs is therefore rapidly increasing for use with control circuits, IC cards (memory cards), and the like. In order to realize an EEPROM having a large capacity in particular, its memory cell has the structure such as shown in FIGS. 7A to 7C.

FIG. 7A is a plan view showing a pattern layout, FIG. 7B is a cross sectional view taken along line B—B of FIG. 7A, and FIG. 7C is a cross sectional view taken along line C—C of FIG. 7A. In these figures, reference numeral 11 represents a floating gate made of a polysilicon first layer. Reference numeral 12 represents an erase gate made of a polysilicon second layer. Reference numeral 13 represents a control gate made of a polysilicon third layer. The control gate 13 is also used as a word line. Reference numeral 14 represents a P-type substrate. Reference numerals 15 and 16 represent a source and a drain made of an N$^+$-type diffusion layer and formed on the substrate 14, respectively. Reference numeral 17 represents a contact hole. Reference numeral 18 represents a data line made of an aluminum layer connected to the drain 16 via the contact hole 17. Reference numeral 19 represents a gate insulating film at the floating gate transistor region having a thickness of 300 angstroms. Reference numeral 20 represents a gate insulating film having a thickness of 350 angstroms and formed between the floating gate 11 and the erase gate 12. Reference numeral 21 represents a gate insulating film formed between the floating gate 11 and the control gate 13. This gate insulating film 21 is made of a three-layer structure film having an Oxide-Nitride-Oxide (O-N-O) structure. Reference numeral 22 represents a gate insulating film formed between the erase gate 12 and the control gate 13 and also having the O-N-O structure. Reference numeral 23 represents a gate insulating film at a select transistor region which uses the polysilicon layer 13 as its gate electrode. Reference numeral 24 represents a field insulating film, and 25 represents an interlayer insulating film.

The equivalent circuit of the memory cell shown in FIGS. 7A to 7C is shown in Fig. 8, and the equivalent circuit of the capacitance system is shown in FIG. 9. In FIG. 8, $V_D$ represents a drain potential, $V_S$ a source potential, $V_{FG}$ a floating gate potential, $V_{EG}$ an erase gate potential, and $V_{CG}$ a control gate potential. In FIG. 9, $C_{FC}$ represents a capacitance between the floating gate 11 and the control gate 13, $C_{FE}$ a capacitance between the floating gate 11 and the erase gate 12, $C_{FD}$ a capacitance between the floating gate 11 and the drain 16, and $C_{FS}$ another capacitance as viewed from the floating gate 11. In this capacitance system, the initial value $Q_{(i)}$ of electrical charge stored in all capacitors is given by the following equation.

$$Q_{(i)}=(V_{FG}-V_{CG})\,C_{FC}+(V_{FG}-V_{EG})\,C_{FE}+(V_{FG}-V_D)\,C_{FD}+(V_{FG}-V_S)\,C_{FS} \quad (1)$$

The total capacitance $C_T$ is given by the following equation.

$$C_T=C_{FC}+C_{FE}+C_{FD}+C_{FS} \quad (2)$$

The voltage $V_{FG}$ applied to the floating gate is therefore given by the following equation.

$$V_{FG}=\{(V_{CG}C_{FC}+V_{EG}C_{FE}+V_DC_{FD}+V_SC_{FS})/C_T\}+\{Q_{(i)}/C_T\} \quad (3)$$

By substituting $Q_{(i)}/C_T=V_{FG(i)}$ and $V_s=0$ V into the equation (3), we obtain $$V_{FG}=\{(V_{CG}C_{FC}+V_{EG}C_{FE}+V_DC_{FD})/C_T\}+V_{FG(i)} \quad (4)$$

Memory cells, each constructed as above, are actually disposed in a matrix within a memory cell array. For simplicity of description, a four bit memory array having four memory cells M1 to M4 is shown in FIG. 10. Each of the drains 16 of the four memory cells M1 to M4 is connected to two data lines DL1 and DL2. Each of the control gates 13 is connected to two word lines WL1 and WL2. The erase gates 12 are commonly connected to one erase line EL, and the sources are applied with a reference voltage (e.g., 0 V).

In the memory cell array constructed as above, data is erased collectively for all the memory cells M1 to M4. More in particular, the source potential $V_S$, drain potential $V_D$ and control gate potential $V_{CG}$ of each memory cell are set to 0 V (namely, the data lines DL1 and DL2, and word lines WL1 and WL2 are set to 0 V), and the erase gate potential $V_{EG}$ is set to a high potential (e.g., +20 V). In this case, by the Fowler-Nordheim's tunnel effect, electrons in the floating gate 11 are emitted to the erase gate 12 by the electric field so that the floating gate 11 is charged positive. Assuming that the potential $V_{FG(i)}$ of the floating gate 11 rises for example to +3 V (assuming in this case the threshold voltage $V_{TH}$ of the floating gate transistor is 1 V), then an inversion layer is formed under the floating gate 11 so that the threshold voltages of the memory cells M1 to M4 become lower. This state assumes that data "1" is being stored.

Consider next writing data in a selected memory cell, e.g., memory cell M1 in the memory cell array. In order to write data in the selected memory cell M1, the control gate potential $V_{CG}$ (potential at the word line WL1) for the selected memory cell M1 is set to a high potential, e.g., +12.5 V, the drain potential $V_D$ (potential at the data line DL1) is set to a high potential, e.g., +10 V, and the source voltage $V_S$, and potentials at the data line DL2 and word line WL2 are set to 0 V. The erase gate potential $V_{FG}$ is set to +5 V for example so that the potential at the floating gate 11 rises to alleviate writing data into the selected cell M1. The hot electron effect occurs near the drain 16 of the selected cell M1 so that electrons generated by impact ionization are injected into the floating gate 11. With the control gate potential $V_{CG}$ of 12.5 V, the floating gate potential $V_{FG}$ will become 10.5 V according to the equation (4). However, the potential at the erase gate 12 as seen from the floating gate 11 is −5.5 V because the erase gate potential $V_{EG}$ is 5 V. By applying 5 V to the erase gate 12 as in the above case, electrical field is relaxed relative to the erase gate at the floating gate of a non-selected cell M2 connected to the same word line as that of the selected cell M1. Accordingly, erroneous operation due to erroneous data writing can be avoided, resulting in improved reliability. Apart from the above discussion, the voltage stress applied between the drain 16 and the floating gate changes greatly with whether the data of a memory cell is "1" or "0". The voltage stresses applied between the drain 16 and the floating gate 11 of each of four memory cells M1 to M4 are summarized in Table 1.

16 is applied with 0 V). As described above, m represents the number of rows, and n represents the number of columns.

For example, for a memory of 1 M bits (128K words × 8 bits), n=128 and m=1024. Assuming that a data write time for one bit is 1 ms, the stress time during the possible erroneous data erase state is given by $$1 \text{ ms} \times (1024-1) = 1.023 \text{ second} \tag{a}$$

The stress time during the possible erroneous data write state is given by

TABLE 1

| CELL | CELL DATA | WL1 | WL2 | DL1 | DL2 | $V_{BG}$ | $V_{FB}$ | $V_D$-$V_{FG}$ | MODE |
|------|-----------|-----|-----|-----|-----|------|------|--------|------|
| M1   | "1"       | 12.5 V |   | 10 V |   | 5 V | — | — | DATA WRITE |
|      | "0"       |     |     |     |     |      |      |        |      |
| M2   | "1"       | 12.5 V |   |     | 0 V | 5 V | 10.5 V | −10.5 V | POSSIBLE WRITE ERROR |
|      | "0"       |     |     |     |     |      | 4.5 V | −4.5 V | — |
| M3   | "1"       |     | 0 V | 10 V |     | 5 V | 3.0 V | 7.0 V | — |
|      | "0"       |     |     |     |     |      | −3.0 V | 13.0 V | POSSIBLE ERASE ERROR |
| M4   | "1"       |     | 0 V |     | 0 V | 5 V | 3.0 V | −3.0 V | — |
|      | "0"       |     |     |     |     |      | −3.0 V | 3.0 V | — |

The maximum voltage stress to the floating gate among non-selected memory cells M2 to M4 in FIG. 10 is applied to the non-selected memory cell M3 when it has data "0", the control gate thereof being connected to the word line WL2 different from the word line WL1 of the selected memory cell M1. Specifically, as seen from Table 1, a voltage of +13.0 V is applied between the floating gate 11 and drain 16 of the non-selected cell M3. Electrons in the floating gate 11 are therefore likely to be emitted to the drain, and in some cases there is a fear of erroneously erasing the data. The case, second likely to be operated erroneously, is for the memory cell M2 when it has data "1". In this case, electrons are likely to be injected into the floating gate, resulting in a fear of writing data erroneously.

FIG. 11 is a circuit diagram showing a conventional memory having memory cells described above. In FIG. 11, each of cells 30 in a memory cell array 31 is connected to n data lines DL1 to DLn, and each control gate 13 is connected to m word lines WL1 to WLm. Erase gates 12 of the memory cells 30 are commonly connected to an erase line EL, and a reference voltage, e.g., 0 V is applied to the sources 15. The erase gates of all the memory cells 30 in the memory cell array are commonly connected so that a voltage $V_{EG}$ is applied to the erase gates of all the memory cells 30 at the same time when data is written. In FIG. 11, reference numeral 32 represents a row decoder, 33 a column decoder, 34-1 to 34-n column select transistors, 35 a bus line, 36 a data input circuit, 37 a sense amplifier circuit, 38 a data output circuit, 39 an erase voltage booster circuit, and 41 an address buffer.

Consider the case where it takes a time t to write data in one cell (one bit) and data is written sequentially for all bits. The maximum time while a stress is applied to a non-selected memory cell becomes (m−1)×t per one bit (one cell) (for example, the stress time for a non-selected memory cell M3 in the possible erroneous data erase state as described with Table 1, is the time duration while the control gate 13 is applied with 0 V and the drain 16 is applied with 10 V). On the other hand, the maximum time while a stress is applied to a non-selected memory cell becomes (n−1)×t per one bit (one cell) (for example, the stress time for a non-selected memory cell M2 in the possible erroneous data write state as described with Table 1, is the time duration while the control gate 13 is applied with 12.5 V and the drain $$1 \text{ ms} \times 127 = 127 \text{ ms}$$

These stress times pose no practical problem when it is considered that the thickness of the insulating film of the floating gate 111 is 300 angstroms and that the probability of erroneous data erase or write is proportional to the stress time.

FIGS. 12A to 12C show a second example of a conventional EEPROM cell having no erase gate. Like elements to those in FIGS. 7A to 7C are given identical reference numerals. Points of difference from the EEPROM shown in FIGS. 7A to 7C reside in that the EEPROM shown in FIGS. 12A to 12C has no erase gate and no select transistor having the control gate 13 as its gate, and the floating gate 11 is in direct contact with the source 15 and drain 16. The floating gate insulating film 19 is formed as thin as about 100 angstroms.

Next, the operation principle of the EEPROM shown in FIGS. 12A to 12C will be described.

In erasing data, the source 15 is applied with an erase voltage of 10 V, the drain 16 is made to enter a floating state, and the control gate 13 is set to 0 V. As a result, a high voltage is applied via the thin floating insulating film 19 across the floating gate 11 and source 15. In this condition, by the Fowler-Nordheim's tunnel effect, electrons in the floating gate 11 are emitted to the source 15 to thereby erase the data.

In writing data, the drain 16 is set to about 6 V, the source to 0 V, and the control gate 13 to 12 V. In this condition, hot electrons generated near at the drain 16 are injected into the floating gate 11 to thereby write the data.

In reading data, the drain 16 is set to 1 V, the source 15 to 0 V, and the control gate 13 to 5 V. In this condition, the data "0" or "1" is read which is determined in accordance with whether or not electrons are present in the floating gate 11.

Memory cells described above may also be used in place of memory cells shown in FIG. 11 to form a memory cell array. In this case, the erase lines EL are connected to the sources $V_S$ common for all memory cells. In this arrangement, data can be erased collectively for all memory cells.

In the first conventional technique described above, the stress state of all memory cells is cleared upon collective erase. Therefore, even if write and erase (hereinafter abbreviated as W/E) operations are repeated for example $10^4$ times, the stresses will not be accumulated, thereby posing no problem.

However, with collective erase, data not desired to be erased is forced to be erased. In this case, the collective erase is not useful and is associated with various difficulties. In order to solve this problem, it may be considered that the memory cell area is divided into a plurality of small sub-areas (hereinafter called blocks) and data is erased on the block unit basis (hereinafter called block erase). In more particular, erase gates of memory cells connected to two word lines are coupled together. In erasing data, one of a plurality of such common erase lines is selected and applied with an erase voltage $V_{EG}=20$ V by means of an erase decoder (not shown). In this manner, only memory cells belonging to the selected block can be erased, thus allowing block erase.

Consider the time while a stress is applied to a non-selected cell for the case where cells are divided into blocks. First, consider the stress time with possible erroneous data write (refer to Table 1). This stress time is the same as for collective erase without dividing into blocks. Next, consider the stress time with possible erroneous data erase (refer to Table 1). The maximum stress time under the condition that all blocks (corresponding to 1022 word lines) other than the selected block (corresponding to 2 word lines) repeat W/E operations $10^4$ times, is given by $$1 \text{ ms} \times 1022 \times 10^4 = 10200 \text{ seconds}$$

Such a long term stress time may cause erroneous data erase.

The EEPROM in FIGS. 12A to 12C shown as the second conventional example has its memory cell constructed by using only two polysilicon layers so that it is suitable for miniaturization. However, as described above, in block erase, a large stress is applied to the drain of non-selected cells. In addition, the insulating film 19 in particular is as thin as 100 angstroms so that practical block erase is difficult.

SUMMARY OF THE INVENTION

The present invention has been made while considering the above problems. It is therefore an object of this invention to provide a non-volatile semiconductor memory wherein the memory cell array is divided into a plurality of blocks and a stress is not allowed to be applied to non-selected blocks during data write to thereby prevent erroneous operation of non-selected memory cells during the data write.

According to one aspect of the present invention, the non-volatile semiconductor memory cell comprises:

a plurality of blocks each having a plurality of floating gate transistors as memory cells, the floating gate transistor having a drain, a source, a floating gate, and a control gate capacitively coupled to the floating gate, and a data program of the floating gate transistor being effected by data write through injection of electrons into the floating gate and by data erase through emission of electrons from the floating gates;

means for applying an erase signal to a selected one of the blocks to emit electrons from the floating gates of a plurality of memory cells in the selected block and to erase data in all of said memory cells in said selected block at the same time; and means for applying an erase signal to the drains of the floating transistors in the selected block, without applying the write signal to the drains of the floating gate transistors in non-selected blocks.

DESCRIPTION OF THE PREFERRED EMBODIMENTS

In brief, in the embodiments of this invention, a memory cell array is divided into a plurality of blocks to erase data in the block unit basis and to prevent a voltage stress to non-selected blocks during data write. With this arrangement, the embodiments realize high reliability of W/E cycles.

Figure 1:
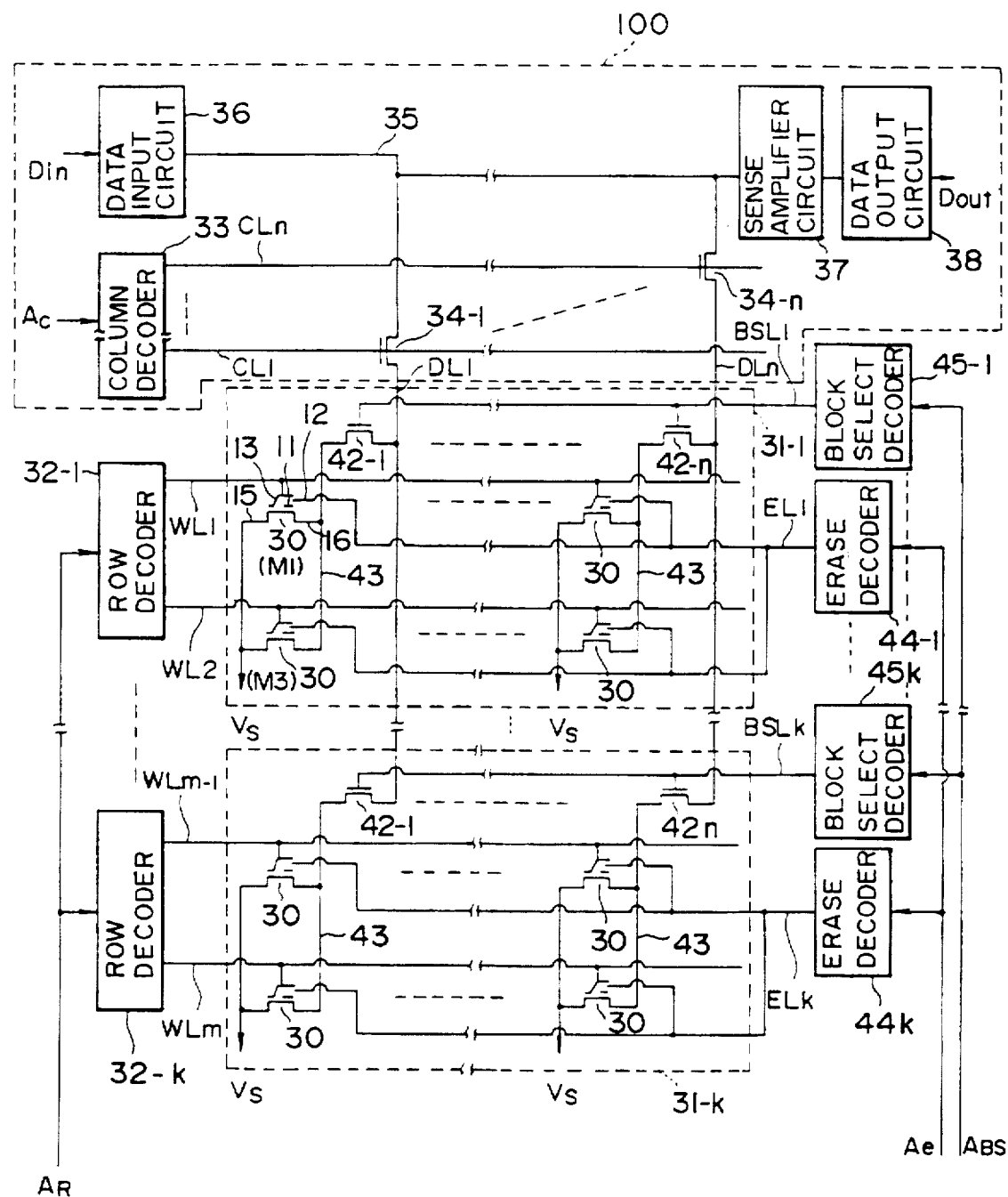
FIG. 1 is a circuit diagram showing a first embodiment of this invention.
Figure 11:
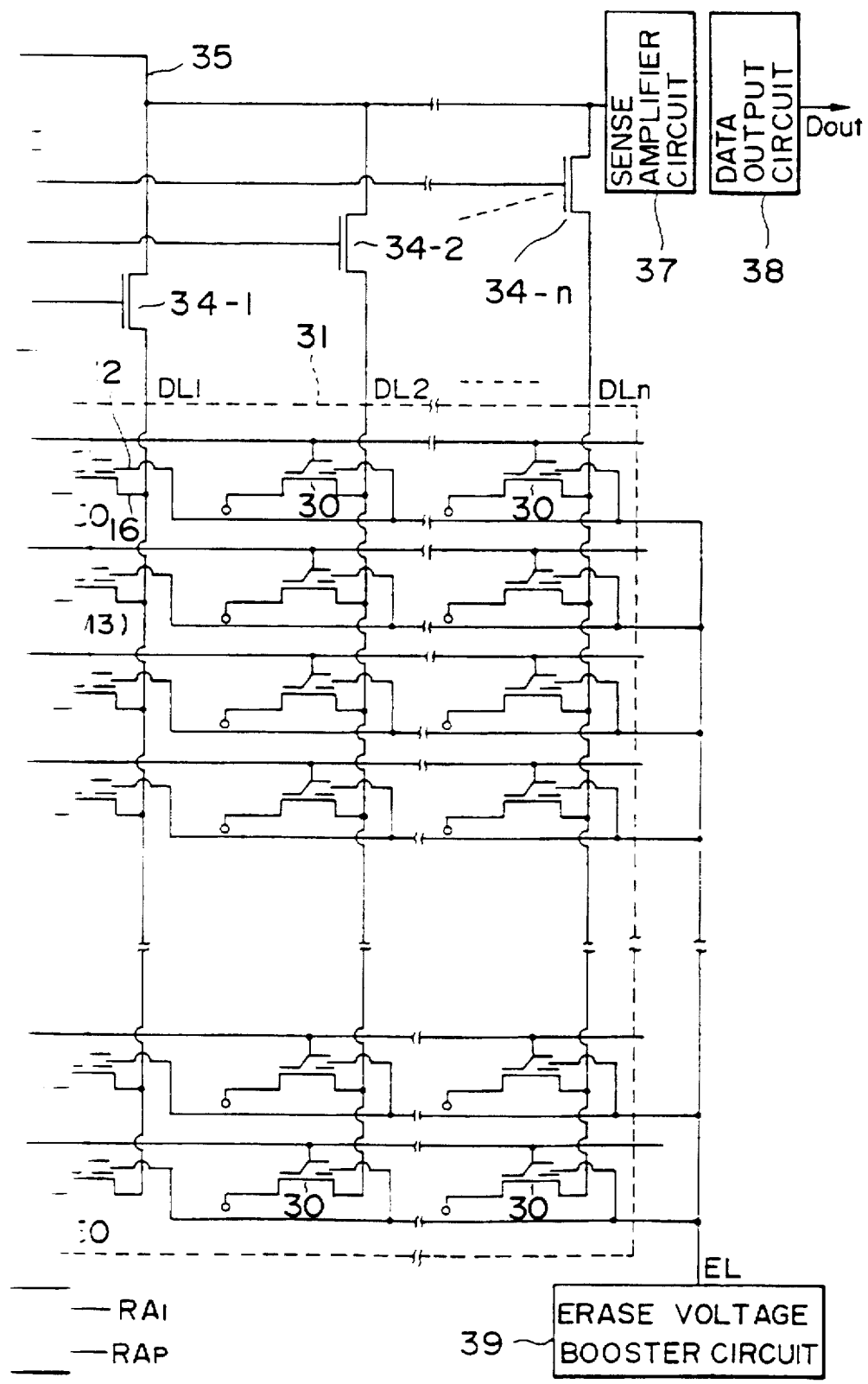
FIG. 11 is a circuit diagram of a conventional memory.

FIG. 1 shows the first embodiment of this invention. In FIG. 1, like elements to those shown in FIG. 11 are represented by identical reference numerals and symbols of FIG. 1. In FIG. 1, Ac represents a column address, Ar a row address, Ae an erase address, and $A_{BS}$ a block select address.

Each memory cell array 31-1 to 31-k is a set (block) of memory cells connected to a plurality of word lines (in this case, two word lines). The word lines of each block is connected to the corresponding one of row decoders 32-1 to 32-k. In each block (each memory cell array 31-1 to 31-k), erase gates of a plurality of memory cells are commonly connected, and the commonly connected erase gate are connected to the corresponding one of the erase lines EL1 to ELk. Erase decoders 44-1 to 44-k are used to select a corresponding one of the erase lines EL1 to ELk. In each block, drains of a plurality of memory cells 30 in the same column are connected to a same common drain 43. This common drain 43 is connected, via the corresponding one of array select transistors 42-1 to 42-n, to the corresponding one of data lines DL1 to DLn. Gates of each of these block select transistors 42-1 to 42-n are connected to the corresponding one of block select lines BSL1 to BSLk. Each of these select lines BSL1 to BSLk is connected to the corresponding one of block select decoders 45-1 to 45-k.

The other structure is substantially the same as that shown in FIG. 11.

The operation of the above-described memory will be described.

The description will be directed to the case where the block of the memory cell array 31-1 is erased.

In this case, first the erase decoder 44-1 is selected so that an erase voltage $V_{EG}$ (about 20 V) is applied to the erase line EL1. The other erase decoders 44-2 to 44-k are not selected, so the erase lines EL2 to ELk are set to 0 V. The word lines of all the arrays 31-1 to 31-k are set to 0 V, the block select lines BSL1 to BSLk are also set to 0 V, and the common drain 43 is set substantially to 0 V. As a result, all memory cells within the memory cell array 31-1 are erased at the same time.

Next, data write will be described. For example, it is assumed that data "0" is supplied to a data input Din and is written in a memory cell M1 within the array 31-1. In this case, a write voltage is outputted from a data input circuit 36 to a common bus line 35 so that the common bus line 35 becomes 12 V. The column select line CL1 is selected by the column decoder 33 so that the column select line CL1 becomes 12 V. In addition, the block select decoder 45-1 is selected so that the block select line BSL1 becomes 12 V. When the column select line CL1 is selected, the data line DL1 becomes 10 V. When the block select line BSL1 is selected, the common drain 43 connected to the transistor 42-1 also becomes 10 V. The row decoder 32-1 selects the word line WL1 so that the word line WL1 becomes 12 V. In this condition, the data is written in the selected memory cell M1.

On the other hand, the non-selected block select lines BSL2 becomes 0 V. Therefore, all the block select transistors 42-1 to 42-n of the non-selected block cell arrays 31-2 to 31-k are being turned off. Accordingly, all the common drains 43 within the non-selected block cell arrays 31-2 to 31-k are generally 0 V (in a floating state). For this reason, a voltage stress is not applied to the drain of each cell 30 within the non-selected cell arrays 31-2 to 31-k.

Next, data read will be described. The description will be directed to the case where data is read from the memory cell M1. In this case, the block select decoder 45-1 is selected so that only the block select line BSL1 becomes 5 V. The other lines BSL2 to BSLk are not selected and become 0 V. The word line WL1 of the selected block 31-1 is selected by the row decoder 32-1 so that the word line WL1 becomes 5 V. When the column select line CL1 is selected by the column decoder 33, the data line DL1 is selected. In this condition, the data is read from the selected memory cell M1. In this case, all the block select transistors 42-2 to 42-k of the non-selected blocks 31-2 to 31-k are being turned off. Therefore, the common drains 43 of the other arrays 31-2 to 31-k are disconnected from the data line DL1 so that parasitic capacitance on the data line DL1 is considerably reduced. Thus, the charge/discharge time of the data line DL1 is shortened and data is read from the memory cell M1 at high speed. If the read speed is allowed to be slower than this, all the block select lines BSL1 to BSLk may be set to 5 V.

The stress time of the memory cell M3 for example will be compared with that of the memory shown in FIG. 11, assuming that the memory of 1 M bits is constructed as shown in FIG. 1. The stress is applied to the memory cell M3 only when data is to be written in the cell M1 within the same block 31-1, and is not applied when data is to be written in any cell within the other blocks 31-2 to 31-k.

Therefore, the stress time of the cell M3 is one data write time in the memory shown in FIG. 1 (wherein two word lines are connected to one row decoder). Assuming that the one data write time is 1 ms similar to the conventional case described above, the stress time is 1 ms which is extremely short as compared with 1.023 sec obtained by the equation (a) in the conventional memory. Consequently, the cell M3 is not erroneously erased in practice.

Figure 2:
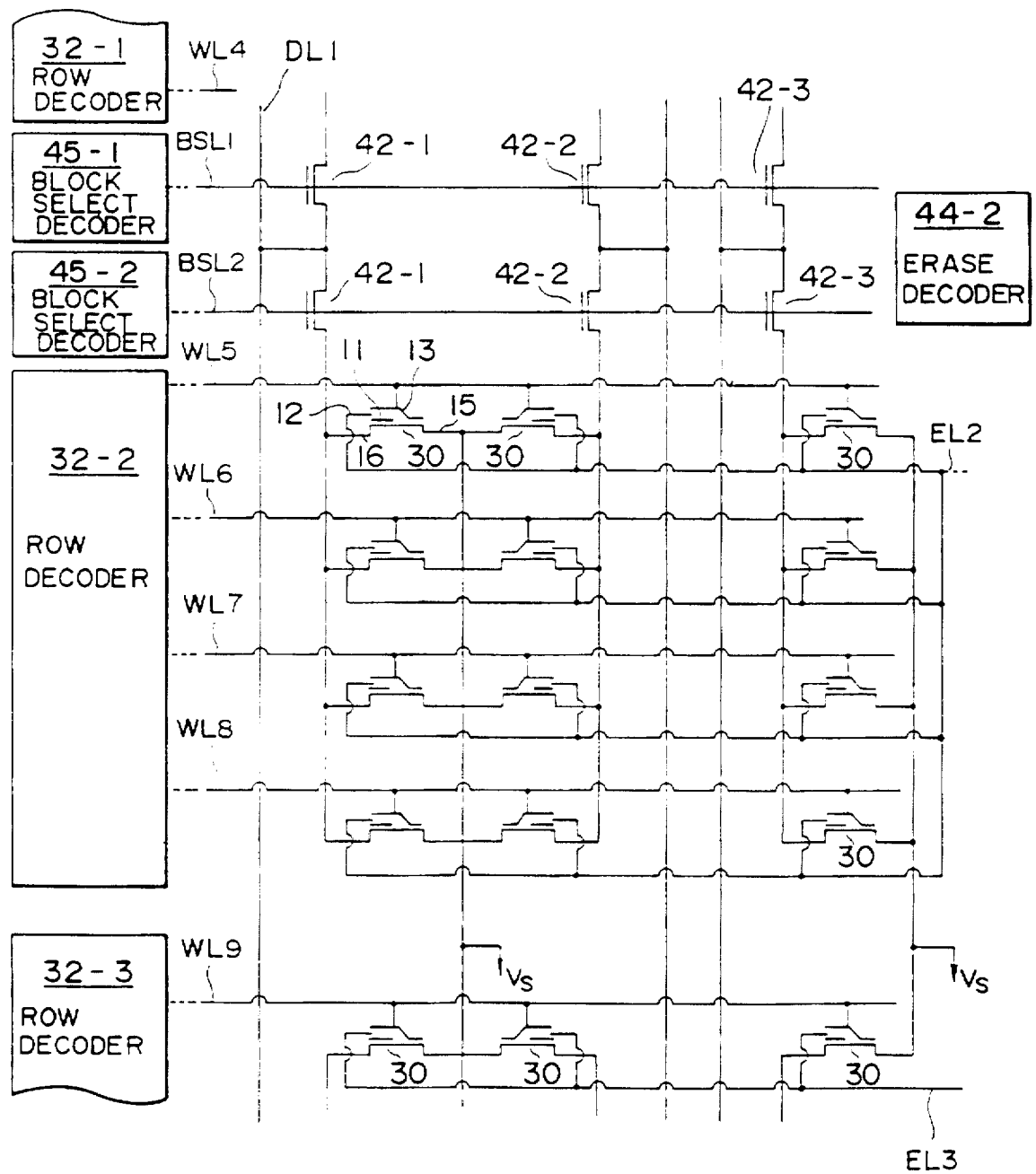
FIG. 2 is a circuit diagram of a part of the actual layout pattern similar to the circuit shown in FIG. 1.
Figure 3A:
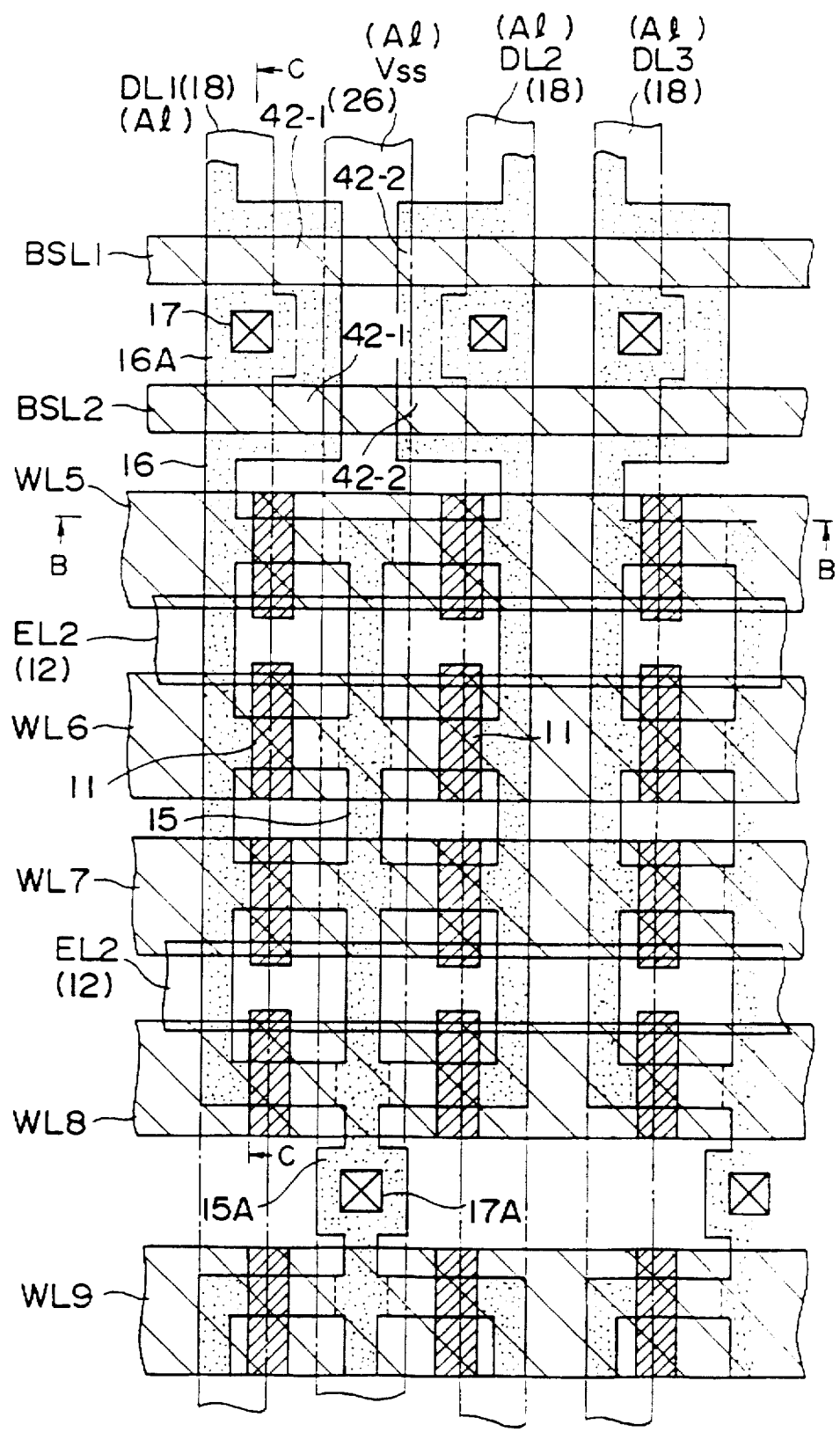
FIG. 3A is a plan view of the layout pattern of FIG. 2.
Figure 3B:
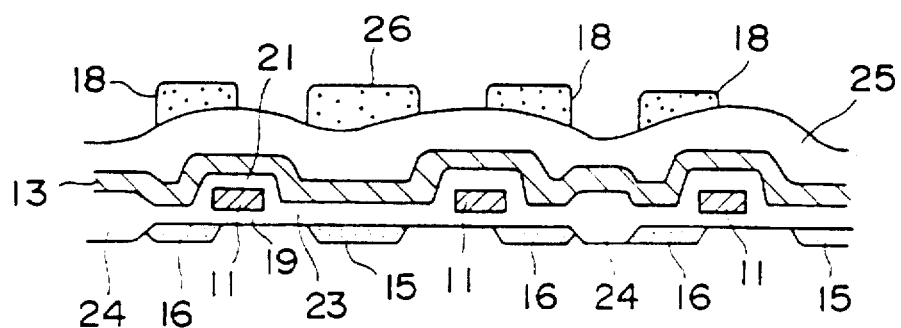
FIGS. 3B and 3C are cross sectional views taken along lines B—B and A—A of FIG. 3A.
Figure 3C:
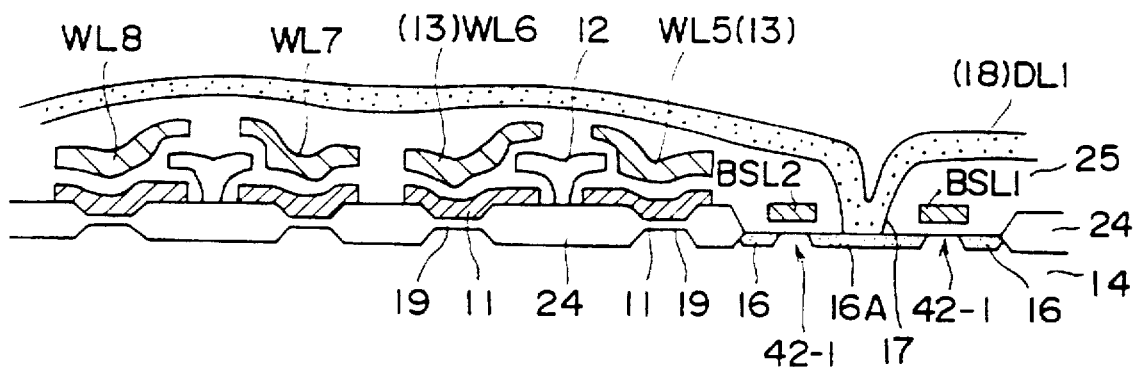
Figure 7A:
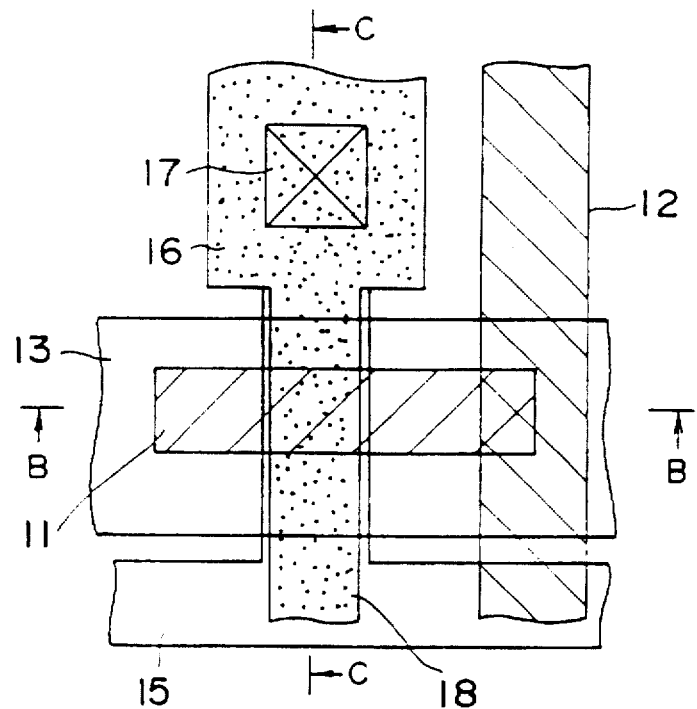
FIG. 7A is a plan view showing the layout of a conventional memory cell.
Figure 7B:
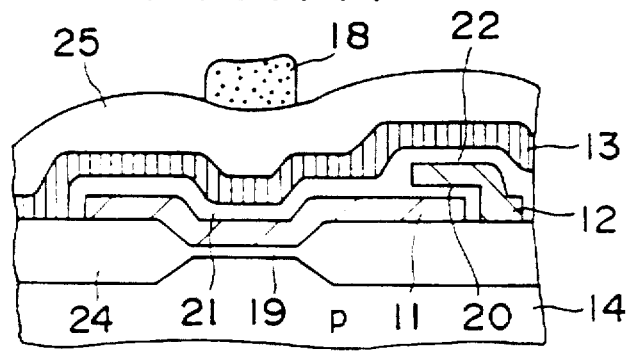
FIGS. 7B and 7C are cross sectional views taken along lines B—B and A—A of FIG. 7A.
Figure 7C:
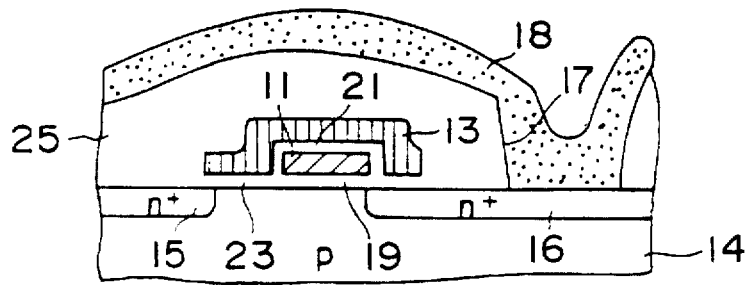
Figure 8:
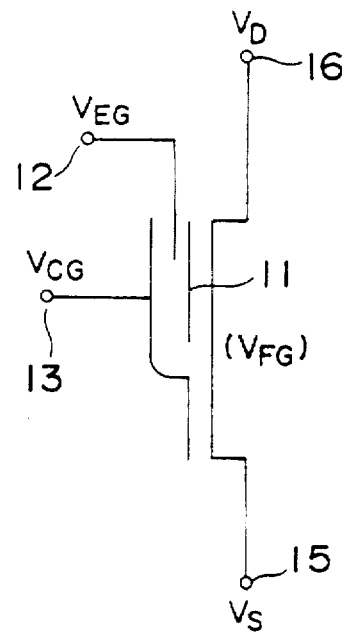
FIGS. 8 and 9 are an equivalent circuit of the memory cell shown in FIG. 7A and an equivalent circuit with respect to capacitances of the memory cell.
Figure 9:
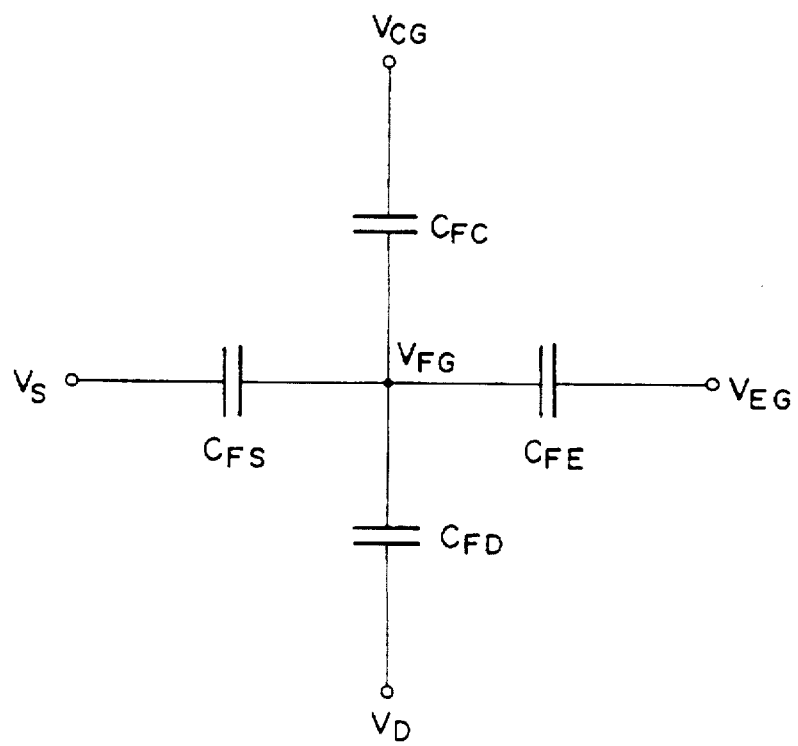
Figure 10:
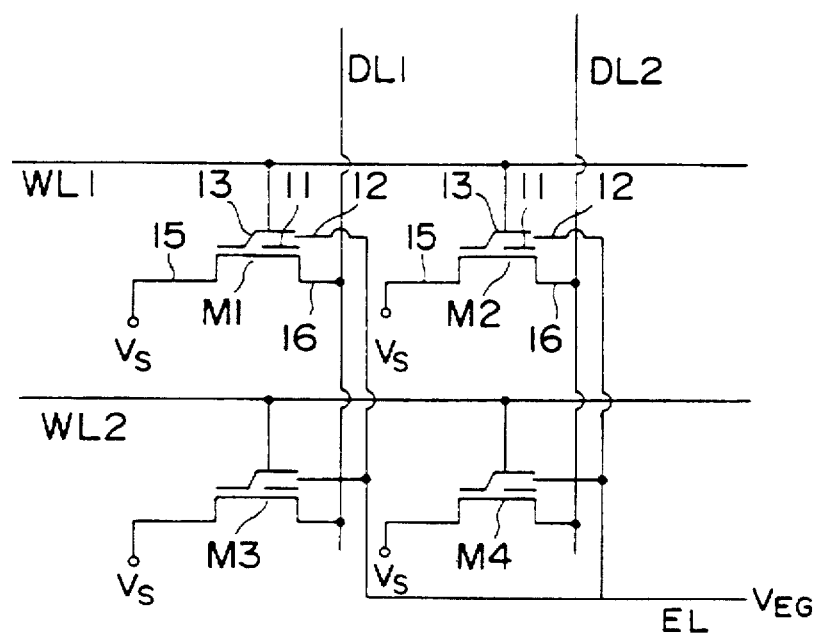
FIG. 10 is a circuit diagram showing a part of a conventional memory cell array.

FIG. 2 is a circuit diagram showing a part of the actual layout pattern similar to the circuit shown in FIG. 1. FIGS. 3A to 3C are a plan view and cross sectional views of the circuit shown in FIG. 2. Namely, FIG. 3A is a plan view, FIG. 3B is a cross sectional view taken along line B—B of FIG. 2, and FIG. 3C is a cross sectional view taken along line C—C of FIG. 2. In FIGS. 3A to 3C, like elements to those shown in FIGS. 7A to 7C are represented by identical reference numerals and symbols.

As seen from FIG. 2, four word lines are contained in each block, so there are four memory cells connected to one data line (e.g. DL1) via the block select transistor 42-1. As seen from FIG. 3A, the characteristic feature of this layout resides in that drains 16 of the four memory cells are commonly connected by using only a diffusion layer 16A without contacting them directly to an A1 layer. The drains 16 commonly connected via the diffusion layer 16A are connected to the block select transistor 42-1. The diffusion layer 16A is connected to the data line (A1) DL 18 via a contact 17. With this layout, only one contact hole is used for eight transistors, within two blocks, connected to one data line, reducing the number of contacts to one fourth the conventional memory per one block and contributing to efficiently reducing the pattern dimension. The sources 15 of a pair of cells 30 are commonly connected by using a diffusion layer 15A which is in turn connected to a $V_{SS}$ line (A1) 26 via a contact hole 17a.

Figure 4:
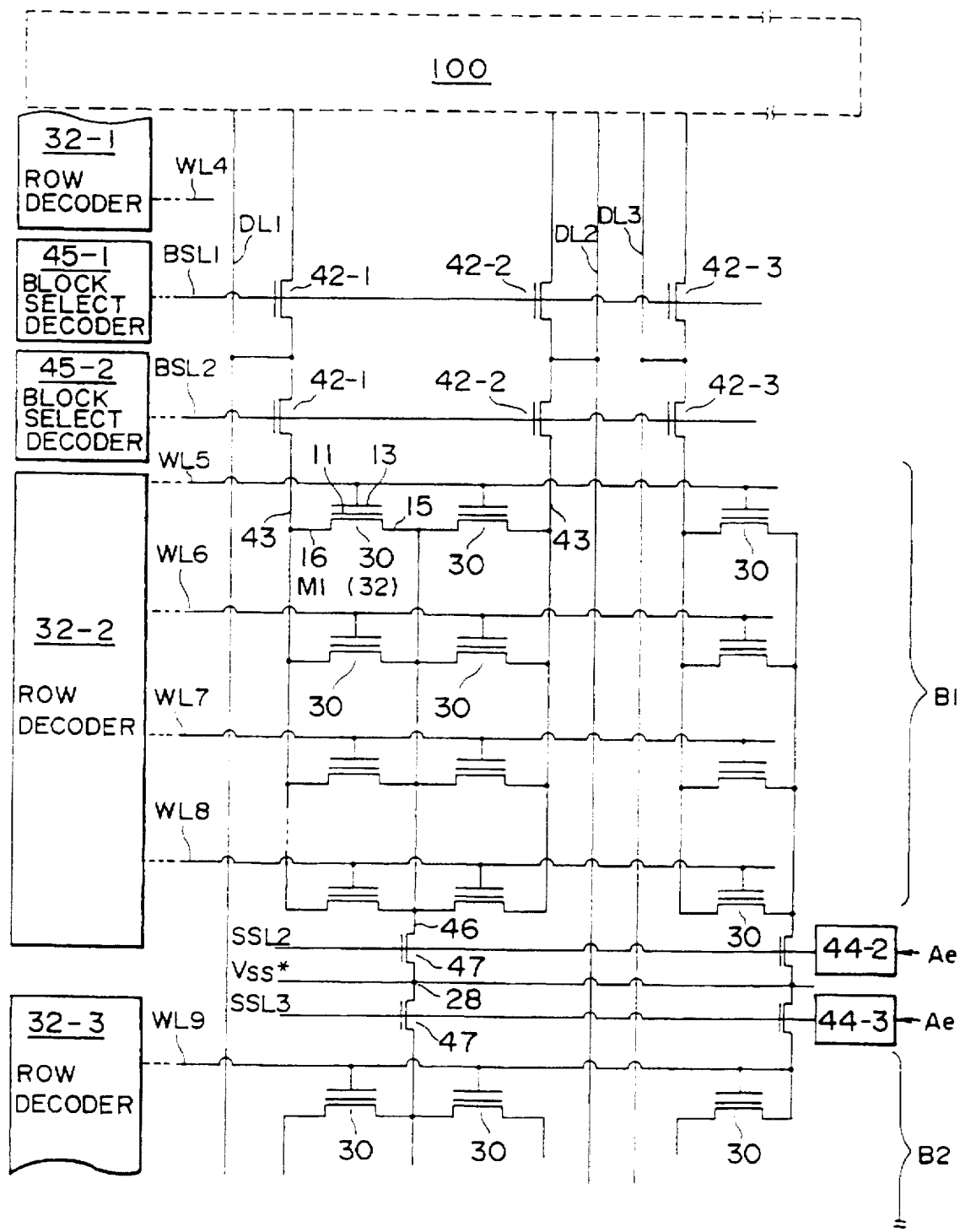
FIGS. 4 and 4A are circuit diagrams of a part of the actual layout pattern of the memory according to second and third embodiments of this invention.
Figure 6:
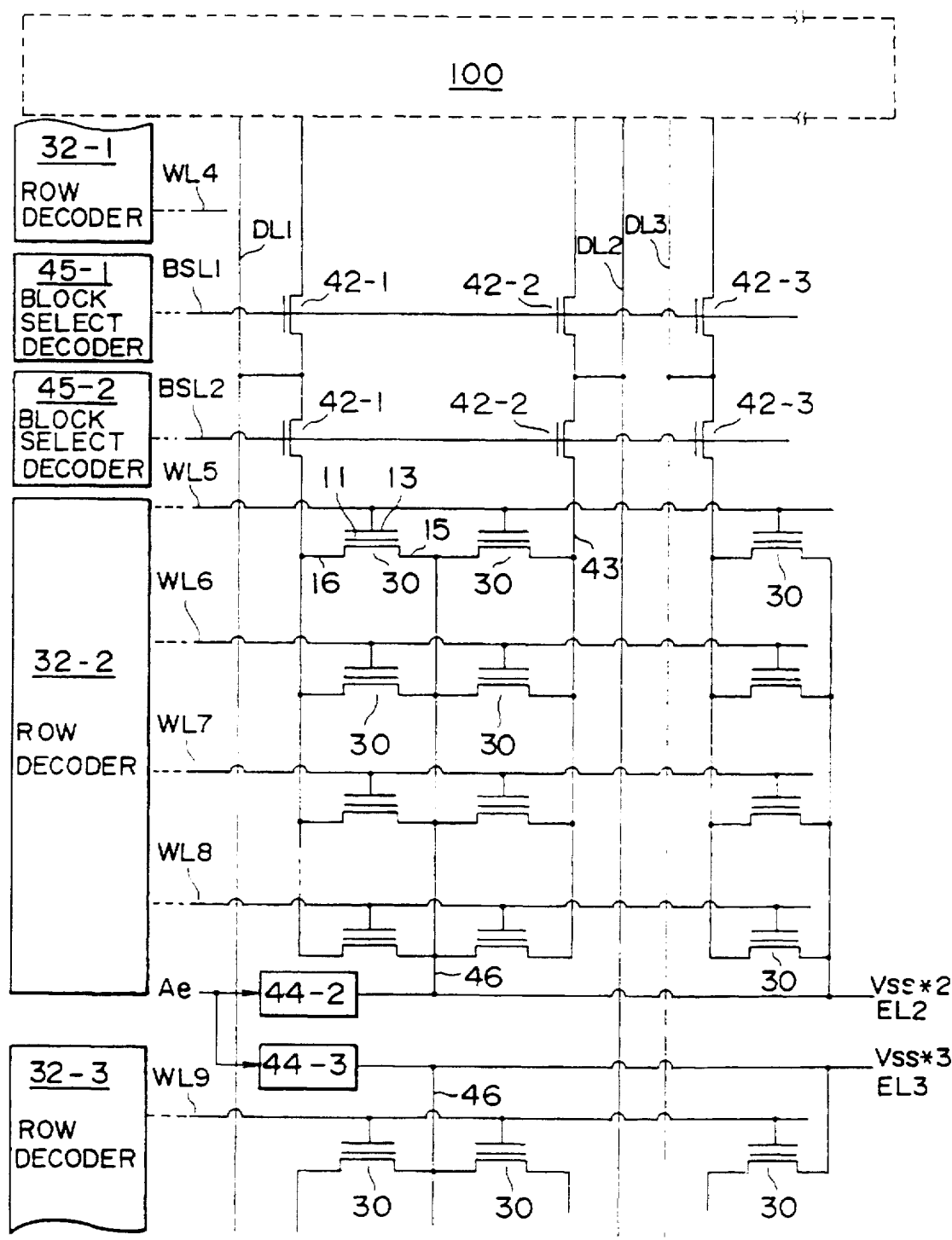
FIG. 6 is a circuit diagram of a part of the actual layout pattern of the memory according to a fourth embodiment of this invention.
Figure 12A:
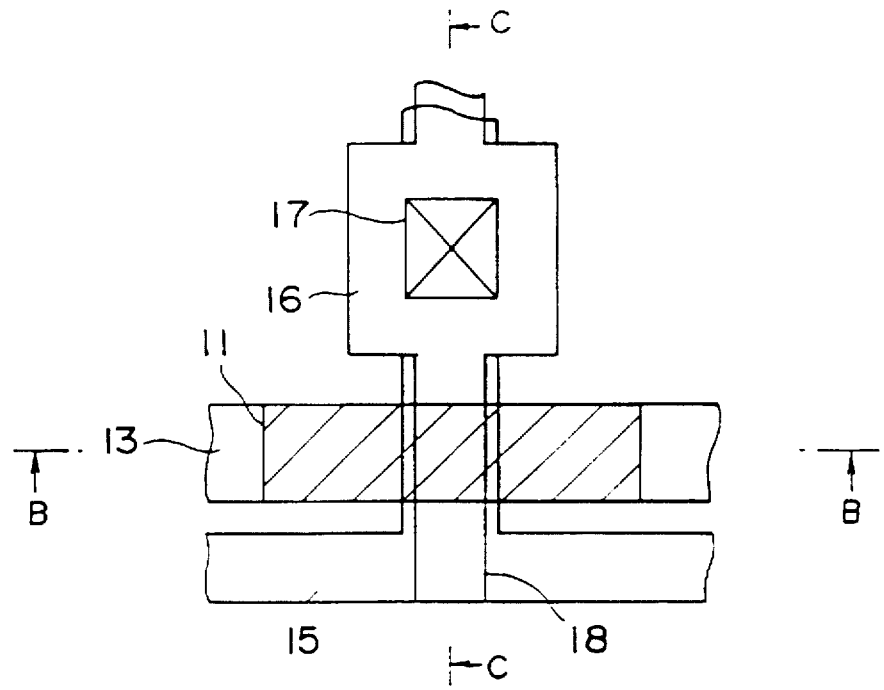
FIG. 12A is a plan view showing the layout of another conventional memory cell.
Figure 12B:
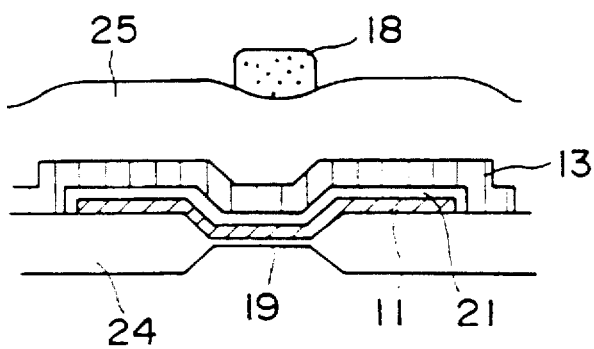
FIGS. 12B and 12C are cross sectional views taken along lines B—B and C—C of FIG. 12A.
Figure 12C:
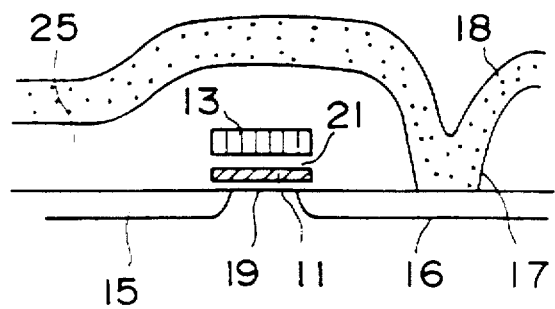

FIG. 4 shows another embodiment also capable of block erase. FIG. 4 corresponds to the memory without an erase gate shown in FIGS. 12A to 12C. The different point of FIG. 4 from FIG. 2 is that there is formed a source select transistor 47 between a common source line $V_{SS*}$ and a common source 46 of memory cells within a block. The gates of these transistors 47 within a block are commonly connected to the corresponding one of source select lines SSL1 to SSLk (in FIG. 4, only SSL2 and SSL3 are shown). The circuit indicated by 100 shown in FIGS. 4 and 6 is the same as the circuit 100 shown in FIG. 1.

The operation of the memory shown in FIG. 4 will be described.

It is assumed that the block having word lines WL5 to WL8 is selected.

In erasing data, the block select line BSL2 and word lines WL5 to WL8 is set to 0 V, and the source select line SSL2 and common source line $V_{SS*}$ are set to 12 V. The source select lines SSL1, SSL3 to SSLk of the non-selected blocks are all set to 0 V. In this condition, there is applied about 10 V only to the common source line 46 of the selected block. On the other hand, an erase voltage is not applied to the sources of memory cells of the non-selected block to avoid data erase.

Data write into the cell M1 will then be described. The data line DL1 and word line WL5 are selected so that it becomes DL1=6 V, and WL5=12 V.

the block select line BSL2 and source select line SSL2 are selected and become 12 V. The common source line $V_{SS*}$ becomes 0 V. In this condition, data is written in the memory cell 30 (M1). In this case, since the block select lines BSL1, BSL3 to BSLk of the other blocks are all set to 0 V, any stress is applied to the drains of memory cells 30 of the non-selected blocks even if the data line DL1 becomes 6 V. It is preferable that the source select lines SSL1, SSL3 to SSLk of the non-selected blocks be set to 0 V. However, even if the source select transistors are being turned on, there occurs no problem.

Figure 4A:
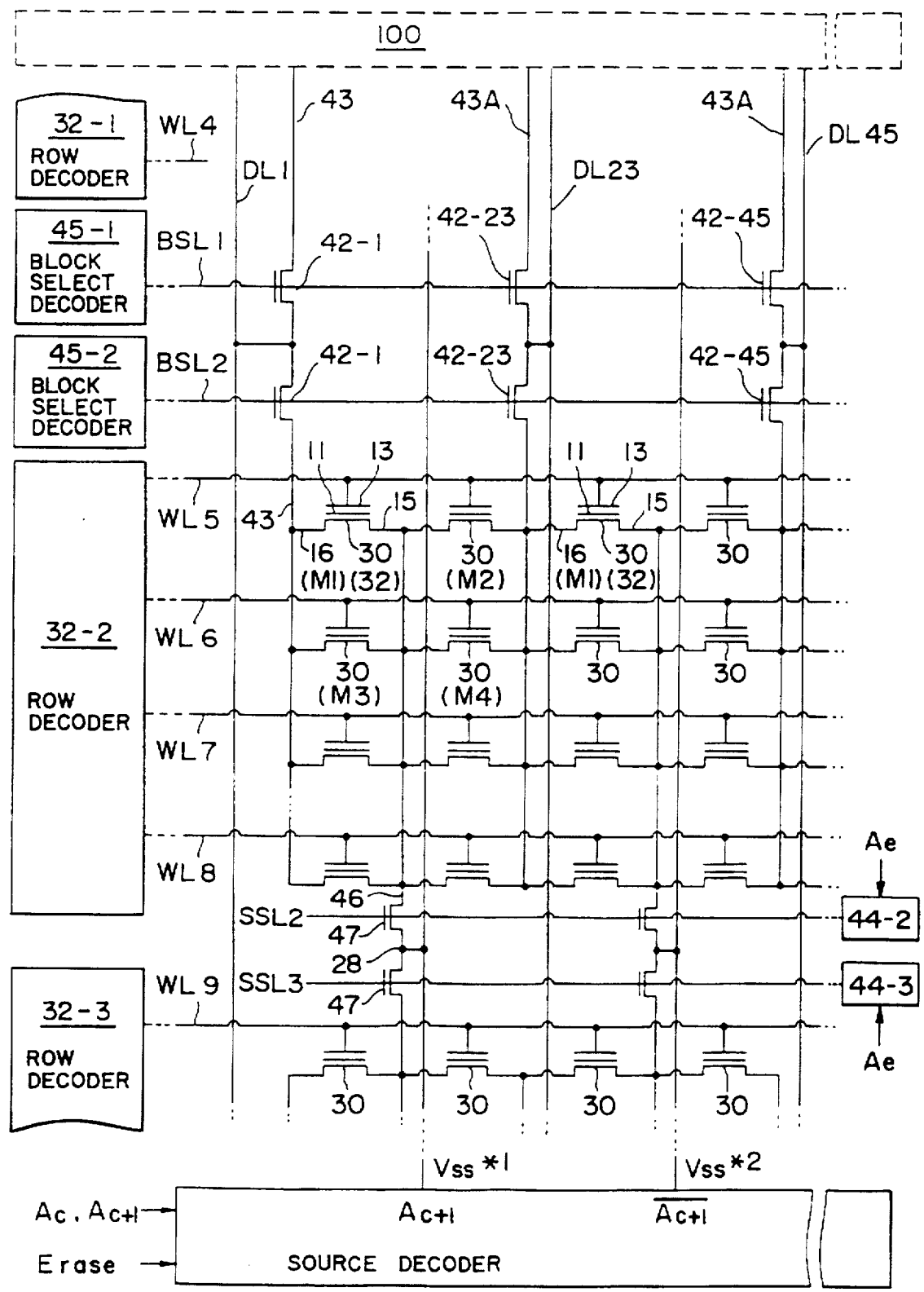

FIG. 4A shows a device that enables a reduction of the width of the device of FIG. 4. The device shown in FIG. 4A is a single data system for two adjacent data lines shown in FIG. 4. For example, the two data lines DL2 and DL3 of FIG. 4 becomes the one data line DL23. The two common drains 43, 43 positioned on each side of the two data lines that were one data line, become the one common drain 43A. The two common drains 43, 43 are made into the one common drain 43A and so the two array selector transistors that were respectively connected to the drains 43, 43 become one array selector transistor. For example, the selector transistors 42-2 and 42-3 become the one array selector transistor 42-23. Furthermore, in FIG. 4A, between the two cells (for example M1 and M2) that are symmetrical left and right is formed a common source line $V_{SS*1}$ and $V_{SS*2}$. The source voltage that is applied to those common source lines is determined by the source decoder SD. The source decoder SD has the array address $A_C$ (see FIG. 1), $A_{C+1}$ and the erase signal Erase applied to it.

In FIG. 4A, those portions that are the same as those in FIG. 4 are indicated with the same numerals.

The data write, read and erase operations in FIG. 4A are performed by applying a voltage to each of the lines in the same manner as shown in FIG. 4. However, in the case of FIG. 4A, the selection of the common source line for each of the operations differs from that for FIG. 4. More specifically, when there is erase, the Erase signal is applied to the source decoder SD. The source decoder SD applies 12 V to all of the common source lines $V_{SS*1}$ and $V_{SS*2}$. In addition, when there is write, the array decoder 33 (see FIG. 1) makes the data line DL23 for example, 6V due to the array address $A_C$. At this time, the source decoder makes the common source lines $V_{SS*1}$ and $V_{SS*2}$ for example, the 0 V and open status, respectively on the basis of the array addresses $A_C$ and $A_{C+1}$. All common source lines other than these are also in the open status. When there is read, and the data line 23 is selected, for example, only one of the common source lines $V_{SS*1}$ and $V_{SS*2}$ is made 0 V.

Figure 5A:
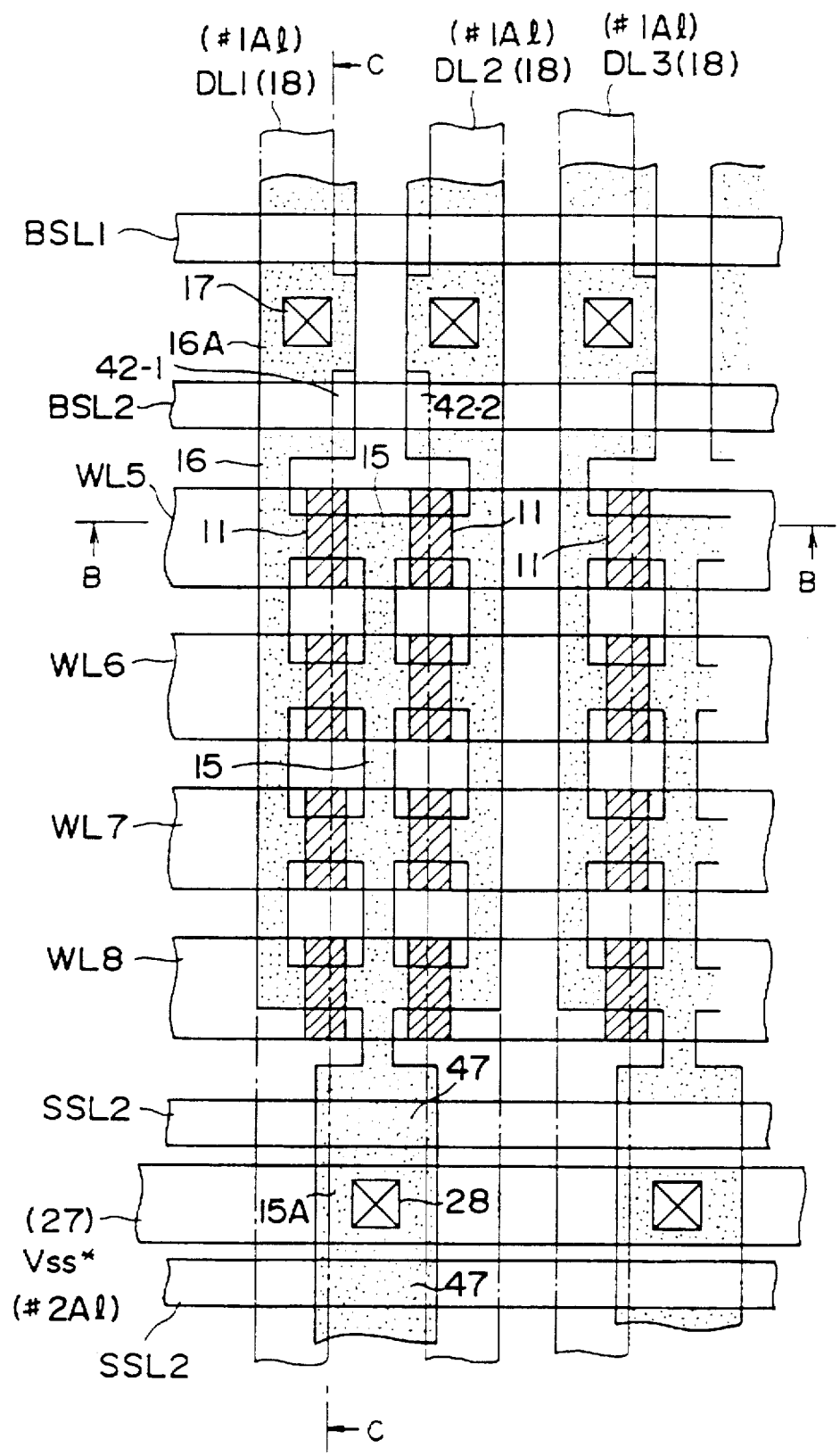
FIG. 5A is a plan view of the layout pattern of FIG. 4.
Figure 5B:
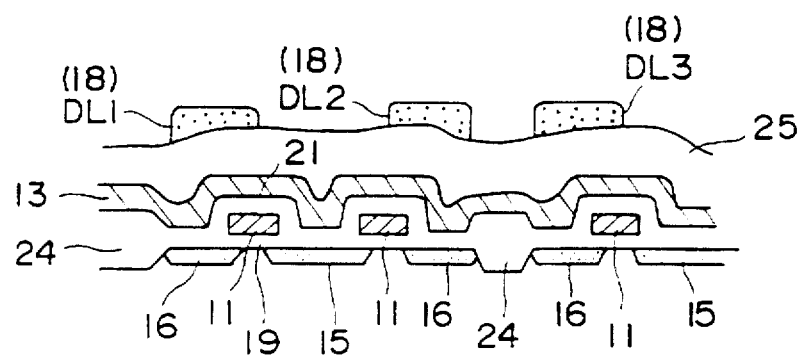
FIGS. 5B and 5C are cross sectional views taken along lines B—B and C—C of FIG. 5A.
Figure 5C:
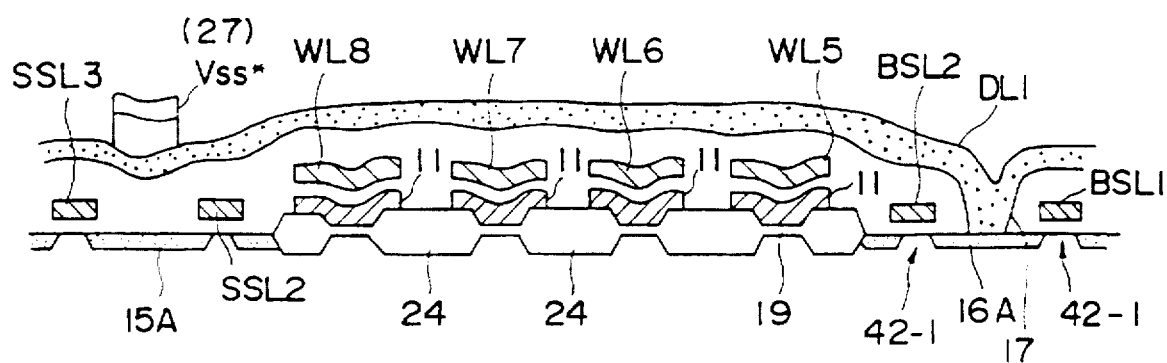

FIGS. 5A to 5C show the actual layout of the circuit shown in FIG. 4. FIG. 5A is a plan view, Fig. 5B is a cross sectional view taken along line B—B of FIG. 4, and FIG. 5C is a cross sectional view taken along line C—C of FIG. 4. The fundamental layout shown in FIGS. 5A to 5C is similar to that shown in FIGS. 3A to 3C. The different points are that the common source line $V_{SS*}$ 27 is made of the second Al layer, the data lines DL1 to DLn are made of the first Al layer, and the common source line $V_{SS*}$ is disposed perpendicular to the data lines DL1 to DLn. With this layout, it is possible to determine the cell pitch in the lateral or row direction in accordance with the pitch of the first AL wirings of the data lines DL1 to DLn.

Contrary to the above, the common source line $V_{SS*}$ may be made of the first Al layer, and the data lines may be made of the second Al layer. Furthermore, the common source line $V_{SS*}$ may be disposed in parallel with the data lines as shown in FIGS. 3A to 3C. With such a layout, although a cell size becomes large more or less, wirings for the common source lines and data lines can be realized with a single Al layer, thereby allowing easy processes.

Another embodiment is shown in FIG. 6. The different point from that shown in FIG. 4 is that instead of providing the source select line and source select transistor, source lines $V_{SS*1}$ to $V_{SS*k}$ (only $V_{SS*2}$ and $V_{SS*3}$ are shown) dedicated to each block are provided to each memory common source 46.

The operation of the memory shown in FIG. 6 will be described. In erasing data, a high voltage is applied only to the common source line of a selected block. Assuming that the block having the word lines WL5 to WL8 is selected, only the common source line $V_{SS*2}$ is selected by an erase decoder (44-2) and applied with 10 V to erase the data of memory cells within the selected block. The common source lines $V_{SS*1}$, $V_{SS*3}$ to $V_{SS*k}$ of the non-selected blocks are set to 0 V, and data erase is not carried out.

In data write and read, all the common source lines $V_{SS*1}$ to $V_{SS*k}$ are set to 0 V. Except for this point, the other signals are the same as the operation described with FIGS. 3A to 3C. In the embodiment shown in FIG. 6, the common source lines $V_{SS*1}$ to $V_{SS*k}$ made of the second Al layer are disposed perpendicular to the data lines made of the first Al layer, similar to the embodiment shown in FIGS. 5A to 5C.

Although not shown, in the embodiment shown in FIG. 6, the common source lines $V_{SS*1}$ to $V_{SS*k}$ may be used in common in the column direction and disposed in parallel with the data lines DL1 to DLk, to allow wirings using only a single Al layer and provide easy processes. In this case, block erase cannot be allowed, but all cells of the memory are collectively erased. If block erase is intended, the common source line $V_{SS*}$ is set to 10 V, only the word lines of the selected block, e.g., the word lines WL5 to WL8, are set to 0 V, and the word lines WL1 to WL4, WL9 to WLm of the other non-selected blocks are all set to 12 V. With this arrangement, the voltage between the floating gate 11 and source 15 of a memory cell connected to the non-selected word line becomes considerably small as compared with that of the selected memory cell. Accordingly, the data in the memory cell connected to the non-selected word line is not erased, but only the data in the memory cell connected to the selected word line is erased.

What is claimed is:

1. A non-volatile semiconductor memory device, comprising:

a memory cell array having a plurality of memory cell blocks arranged in a column direction, each memory cell block including a plurality of non-volatile memory transistors arranged in a matrix pattern, wherein drains and sources of said non-volatile memory transistors that are arranged in a same column are connected in common as a common drain and a common source, respectively, wherein said memory cell array includes data lines each corresponding to a column line of said matrix pattern;

wherein each of the data lines are connected to the common drain of the non-volatile memory transistors arranged in a corresponding column line in each memory cell block via each of a plurality of first switch transistors;

a plurality of row decoders each configured to activate the non-volatile memory transistors arranged in a corresponding row of said matrix pattern;

a plurality of second switching transistors connected on a one-to-one basis to the data lines and each configured to connect a corresponding one of the data lines to an input/output line in a parallel relationship with respect to each other;

a column decoder configured to select any of the second switching transistors;

a plurality of block select decoders connected on a one-to-one basis to the memory cell blocks and each configured to select a corresponding one of the memory cell blocks, to turn on one of the first switching transistors which corresponds to the selected memory cell block, so that the common drain in the selected memory cell block can be connected to each corresponding data line;

a data input circuit connected to the input/output line and configured to transmit write data received externally to the input/output line during a write operation;

a data sense and output circuit connected to the input/output line and configured to sense and to output read data externally during a read operation; and a plurality of erase decoders connected on a one-to-one basis to the memory cell blocks and each configured to select a corresponding one of the memory cell blocks to be erased, and to transmit an erase signal to the selected memory cell block to be erased;

wherein each of the non-volatile memory transistors includes an erase gate responsive to the erase signal applied by the corresponding erase decoder.

2. The non-volatile semiconductor memory device of claim 1, wherein the erase gates of each of the memory cell blocks are connected in common to the corresponding erase decoder.

3. The non-volatile semiconductor memory device of claim 2, wherein the two non-volatile memory transistors that are adjacent to each other in a row direction in each of the memory cell blocks are arranged symmetrically with respect to a corresponding column line by connecting the sources thereof to each other.

4. The non-volatile semiconductor memory device of claim 3, further comprising a plurality of second block decoders provided for the memory cell blocks on a one-to-one basis, wherein each of the common sources is connected to a source potential via a source transistor that is turned on by the corresponding second block decoder.

5. The non-volatile semiconductor memory device of claim 4, further comprising a source decoder having a plurality of potential output terminals each connected to a corresponding common source via a corresponding source transistor (47); wherein a potential of each of the output terminals is determined on the basis of addresses applied to said source decoder.

6. The non-volatile semiconductor memory device of claim 4, wherein in each memory cell block, the corresponding common source is directly connected to an output terminal of the corresponding second block decoder.

* * * * *